United States Patent [19]

Jones et al.

[11] Patent Number: 5,136,244

[45] Date of Patent: Aug. 4, 1992

[54] ARTICULATED NMR SHOULDER COIL WITH FUSIBLE LINK

[75] Inventors: Randall W. Jones, Mukwonago; Dave Donars, New Berlin, both of Wis.

[73] Assignee: Medical Advances, Inc., Wauwatosa, Wis.

[21] Appl. No.: 602,030

[22] Filed: Oct. 22, 1990

[51] Int. Cl.$^5$ .............................................. G01R 33/20
[52] U.S. Cl. ................................. 324/318; 128/653.5
[58] Field of Search ............... 324/300, 307, 309, 318, 324/322; 128/653 R, 653 A, 653 AF, 653 SC

[56] References Cited

U.S. PATENT DOCUMENTS

| 4,427,943 | 1/1984 | Cloutier et al. | 324/326 |
| 5,024,229 | 6/1991 | Bryant et al. | 128/653.5 |

OTHER PUBLICATIONS

"A Fuse for MRI Probes," L. Kyle Hedges, Aug. 20, 1988.

Primary Examiner—Michael J. Tokar
Attorney, Agent, or Firm—Quarles & Brady

[57] ABSTRACT

A whole volume shoulder coil for MRI includes two opposed coils one attached by a knuckle held captive in a sliding track to provide bounded translation rotation and angling of that coil with respect to the opposed coil. The coil position may be fixed by means of a single adjustment which clamps the knuckle against the track. The coils includes fusible links separated from the coil by a current divider which also serves to detune the coil when the fuse is opened. Varactor diodes are used to tune the coil. The DC control voltage for the diodes is combined with the signal from the coil and later separated by tuned filters to reduce cabling.

12 Claims, 3 Drawing Sheets

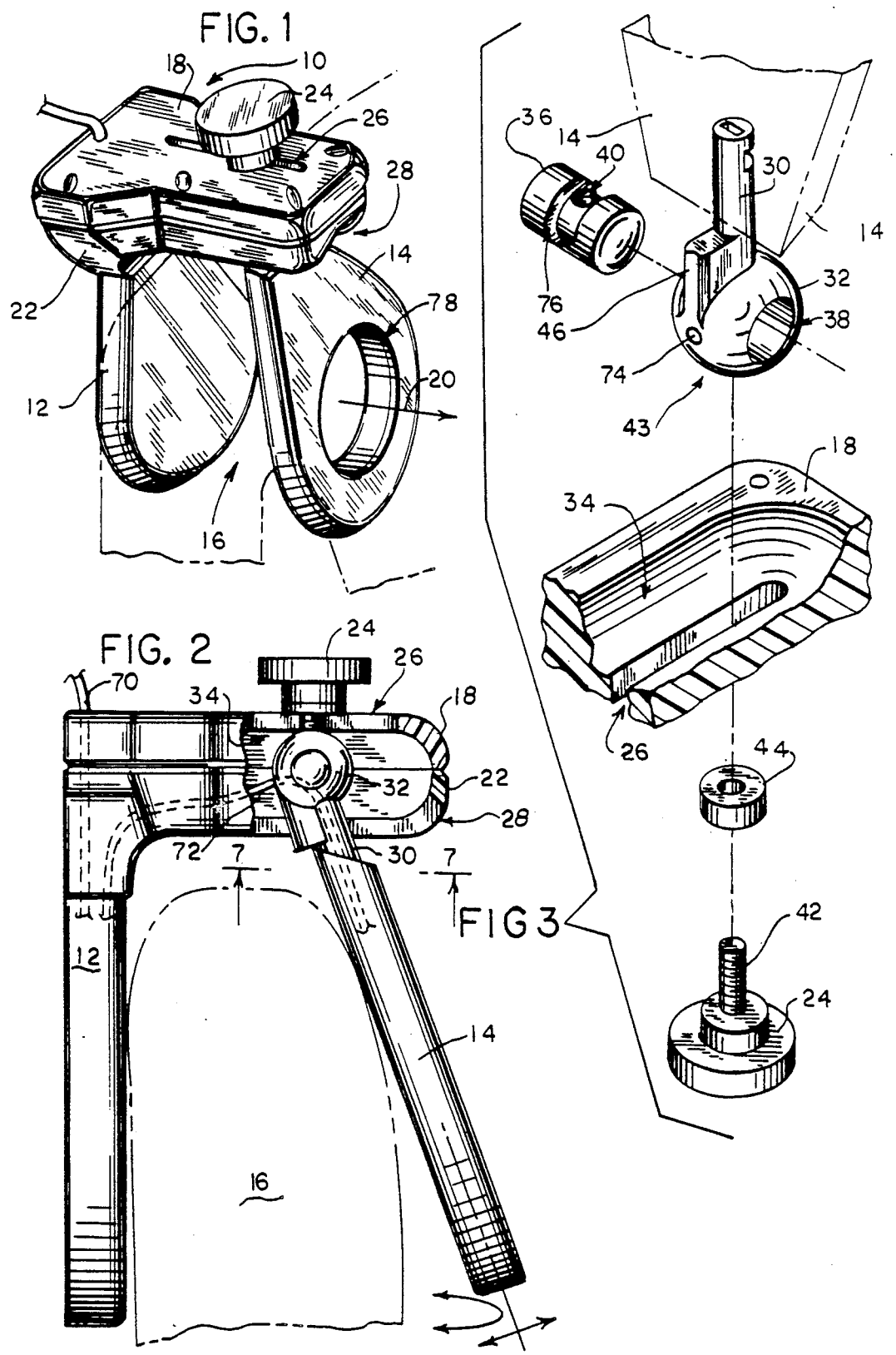

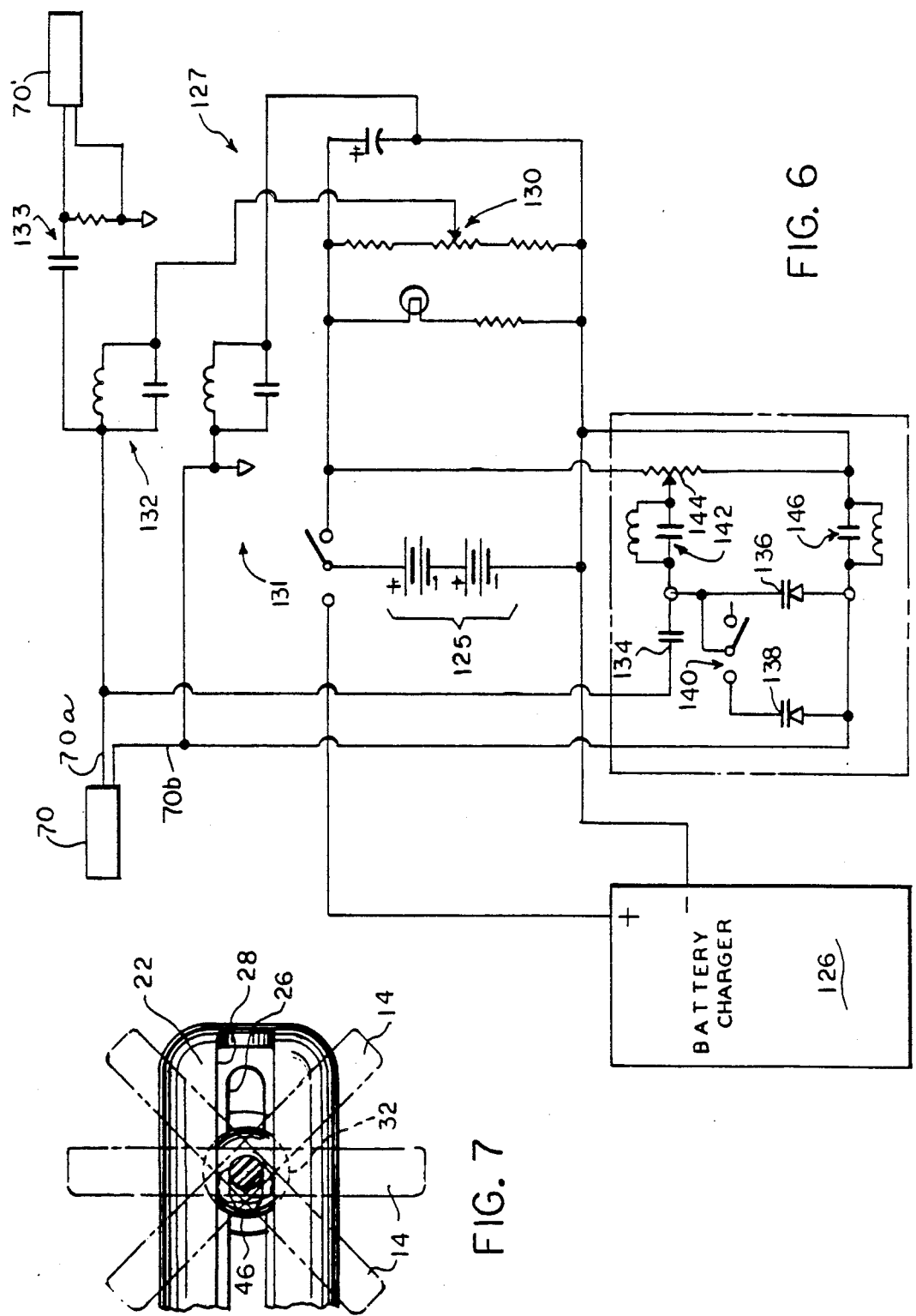

ARTICULATED NMR SHOULDER COIL WITH FUSIBLE LINK

BACKGROUND OF THE INVENTION

1. Field of the Invention

The field of the invention is magnetic resonance imaging (MRI) and in particular local coils for use in receiving MRI signals.

2. Background Art

In MRI, a uniform magnetic field $B_0$ is applied to an imaged object along the z axis of a Cartesian coordinate system, the origin of which is approximately centered within the imaged object. The effect of the magnetic field $B_0$ is to align the object's nuclear spins along the z axis.

In response to a radio frequency (RF) excitation signal of the proper frequency, oriented within the x-y plane, the nuclei precess about the z-axis at their Larmor frequencies according to the following equation:

$$\omega = \gamma B_0$$

where $\omega$ is the Larmor frequency, and $\gamma$ is the gyromagnetic ratio which is constant and a property of the particular nuclei.

Water, because of its relative abundance in biological tissue and the properties of its nuclei, is of principle concern in such imaging. The value of the gyromagnetic ratio $\gamma$ for water is 4.26 kHz/gauss and therefore in a 1.5 Tesla polarizing magnetic field $B_0$ the resonant or Larmor frequency of water is approximately 63.9 MHz.

In a typical imaging sequence, the RF excitation signal is centered at the Larmor frequency $\omega$ and applied to the imaged object at the same time as a magnetic field gradient $G_z$ is applied. The gradient field $G_z$ causes only the nuclei in a slice through the object along a x-y plane to have the resonant frequency $\omega$ and to be excited into resonance.

After the excitation of the nuclei in this slice, magnetic field gradients are applied along the x and y axes. The gradient along the x axis, $G_x$, causes the nuclei to precess at different frequencies depending on their position along the x axis, that is, $G_x$ spatially encodes the precessing nuclei by frequency The y axis gradient, $G_y$, is incremented through a series of values and encodes y position into the rate of change of phase of the precessing nuclei as a function of gradient amplitude, a process typically referred to as phase encoding.

A weak nuclear magnetic resonance generated by the precessing nuclei may be sensed by the RF coil and recorded as an NMR signal. From this NMR signal, a slice image may be derived according to well known reconstruction techniques. An overview NMR image reconstruction is contained in the book "Magnetic Resonance Imaging, Principles and Applications" by D. N. Kean and M. A. Smith.

The quality of the image produced by MRI techniques is dependent, in part, on the strength of the NMR signal received from the precessing nuclei. For this reason, it is known to use an independent RF receiving coil placed in close proximity to the region of interest of the image object to improve the strength of this received signal. Such coils are termed "local coils" or "surface coils". The smaller area of the local coil permits it to accurately focus on NMR signal from the region of interest. Further, such local coils may be of higher quality factor or "Q" than the RF transmitting coil increasing the selectivity of the local coil and the relative strength of the acquired NMR signal.

The smaller size of the local coil makes it important that the local coil be accurately positioned near the region of interest. For "whole volume" coils, employing two antenna loops to receive the NMR signal from a volume defined between the loops, accurate positioning of the coils is particularly important. For a whole volume shoulder coil, for example, the two antenna loops must be placed on opposite sides of the shoulder but generally opposed along a single axis. Further, the relative positions of the coils must be adjustable to accommodate a range of shoulder dimensions. Adjustment of the coil is preferably simple and rapid so as not to prolong unduly the time required to perform the MRI scan.

A major technical problem in NMR systems is "decoupling" the local coil from the RF excitation signal during the application of the RF excitation signal. Such decoupling reduces the distortion of the excitation field by the local coil and prevents potential damage to the sensitive circuits connected to the local coil from large induced voltages.

Inductive coupling between the excitation field and the local coil may focus the deposition of the RF energy on a reduced volume the imaged object. In the case of the medical imaging of a patient, such focused energy may cause burns. Energy coupled to the local coil itself may cause heating of that coil, producing indirect burns to the patient and damage to the local coil and its circuitry. The problem of distortion and inductive coupling is compounded by the typically high Q of the local coils.

One method of decoupling the local coil from the RF excitation field is through the use of one or more solid state switches positioned along the local coil which may be activated either by an external electrical signal or by the RF excitation field itself. These switches disable or detune the local coil. One such approach which shows generally the use of back-to-back diodes for decoupling a local coil is described in U.S. Pat. No. 4,725,779, issued Feb. 16, 1988 to Hyde et al., entitled: "NMR Local Coil with Improved Decoupling" and hereby incorporated by reference.

The semiconductor elements used for decoupling are subject to failure from mechanical damage, thermal stress and aging. Generally it cannot be predicted with any certainty whether a semiconductor will fail as a short circuit or as an open circuit. Depending on the design of the coil, one such failure mode will leave the local coil coupled to the RF excitation field.

The local coil is typically connected to the MRI system by a long cable permitting the coil to be placed first on the patient and the patient then to be positioned within the bore of the polarizing magnet used to generate field $B_0$. Once in place, the local coil may be tuned remotely by means of varactor diodes or similar devices adjusted by a remotely located DC biasing voltage carried on separate conductors in the attaching cable. The ability to tune a local coil may improve the image quality, however the additional conductors needed for the biasing voltage render the connecting cable less flexible and more difficult to position.

SUMMARY OF THE INVENTION

The present invention provides a simple mechanism for positioning and supporting the RF coils of a whole volume local coil. Two antenna loops are held in a first and second paddle. The first paddle is attached to a guide track which is substantially perpendicular to the loop axis of antenna loop of the first paddle. The guide track holds a knuckle which can slide along the track and can rotate about a knuckle axis parallel to the track.

The second paddle is attached to this knuckle so that the axis of its antenna loop is substantially perpendicular to the knuckle axis. A clamp may be used to restrain the knuckle against the track and to lock the first and second paddle in position with respect to each other.

In one embodiment, the guide track has a slotted cover and the knuckle includes a vane which limits rotation of the knuckle in conjunction with the slot in the cover. The knuckle may be clamped against the track by means of a threaded bolt projecting through a slot in the track and received by a threaded hole in a knuckle shaft along the knuckle axis.

It is one object of the invention to provide an easily adjustable mechanism for positioning the two coils of a whole volume coil about a patient. The knuckle provides flexible multi-axis positioning and can be simply locked by the clamp. The freedom of movement of the knuckle may be limited by the vane and cover slot to aid in initial placement and alignment of the coil.

An antenna loop in the coil, having a first and second terminal, may include a non-resistive current divider having a first leg between the first and second terminal of the antenna loop. A fusible link may be connected in series with the second leg of the divider in series between the first and second terminal of the antenna loop.

It is another object of the invention, then, to permit the fusing of the local coil to limit currents in the local coil caused by the inductive coupling of RF energy from the RF excitation field. The current divider prevents the resistance of the fuse from unacceptably affecting the Q of the antenna loop.

The NMR signal from the antenna loop may be coupled to a signal lead through a pickup loop in proximity to the antenna loop. A first leg of a non-resistive current divider is placed in series with this pickup loop. The second leg of the current divider, a fusible link, and a non-linear conductor are connected in series across the first leg of the current divider. The signal lead is connected across the non-linear conductor.

It is thus another object of the invention to provide a means of fusing a local coil so as to positively disconnect the signal lead from the coil in the case of excess current flow. The current divider shunts a fraction of the excess current in the pickup loop through the fusible link causing it to open and to disconnect the signal lead. This disconnection of the signal lead provides an indication to the operator of coil malfunction.

The local coil may be tuned by means of a varactor placed in series with the antenna loop. A first end of a wire is connected to a DC biasing voltage for the varactor and a second end of the wire is connected to the NMR signal from the coil. The second end of the wire is also connected through a band reject filter to the varactor. The frequency of the filter is such as to prevent the passage of the NMR signal to the varactor. The band reject filter also provides a high impedance to the junction of the resonant coil preventing degradation of coil Q.

It is thus a further object of the invention to reduce the number of conductors needed to connect a remotely tunable local coil to the MRI processing equipment. Using the same signal lead to carry the biasing voltage to the varactor and the NMR signal from the coil permits the use of a smaller more flexible signal cable.

Other objects and advantages besides those discussed above shall be apparent to those experienced in the art from the description of a preferred embodiment of the invention which follows. In the description, reference is made to the accompanying drawings, which form a part hereof, and which illustrate an example of the invention. Such example, however, is not exhaustive of the various alternative forms of the invention, and therefore reference is made to the claims which follow the description for determining the scope of the invention.

BRIEF DESCRIPTION OF THE DRAWINGS

FIG. 1 is a perspective view of the local coil of the present invention showing the posterior and anterior paddle in position on a patient;

FIG. 2 is a side elevation of the shoulder coil of FIG. 1 cutaway to show the attachment of the anterior paddle to an adjustable knuckle joint;

FIG. 3 is an exploded detail of the knuckle joint showing a channel of the knuckle shaft for guiding a cable connecting the two paddles and showing the placement of a rotation limiting vane on the knuckle of the knuckle joint;

FIG. 6 is a schematic of a D.C. biasing source suitable for use with the varactors of FIG. 5; and FIG. 7 is a view of the interaction of the rotation limiting vane of the knuckle and the slot in the track cover.

DETAILED DESCRIPTION OF THE PREFERRED EMBODIMENT

Figure 4:
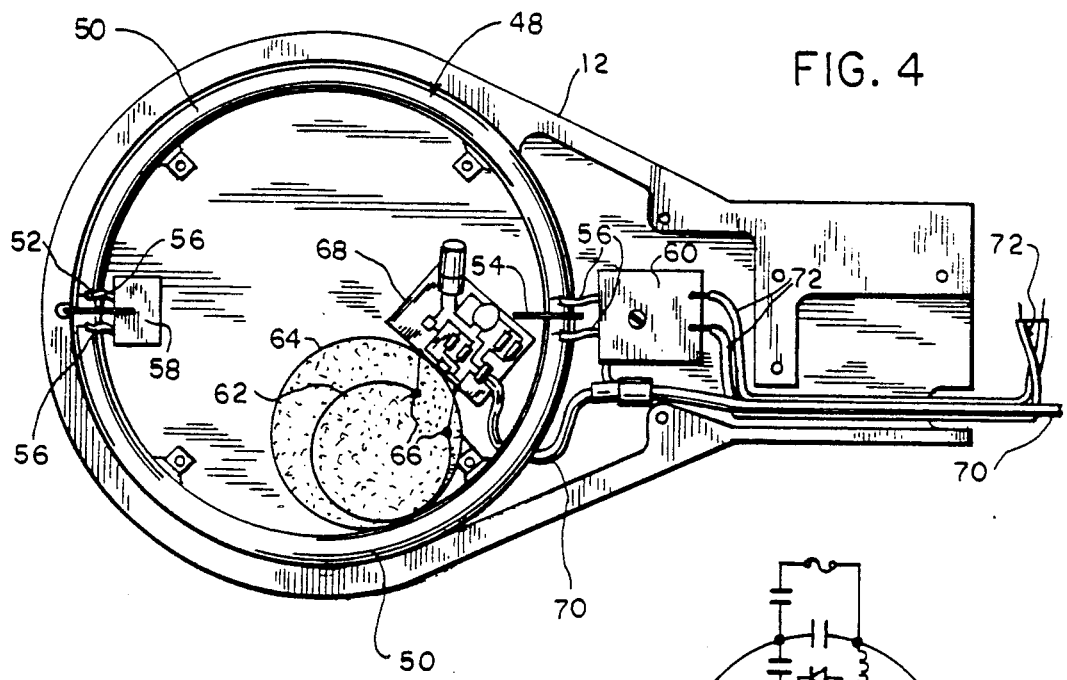
FIG. 4 is a sectional view taken through the posterior paddle of FIG. 1 showing the contained antenna loop and pickup loop.

Referring to FIG. 1, the shoulder coil 10 of the present invention includes a posterior and anterior paddle 12 and 14 extending generally downward, on either side of the shoulder of a patient 16, from a generally horizontal guide track 18. The posterior and anterior paddle 12 and 14 contain antenna loops (not shown in FIG. 1) having loop axes 20 substantially normal to the face of the paddles 12 and 14 and directed generally horizontally through the shoulder of the patient 16.

The guide track 18 includes a cover 22 along its lower surface positioned above the shoulder of the patient 16 during normal use of the coil 10. An adjusting knob 24 above the guide track 18 connects indirectly to the anterior paddle 14 through a first slot 26 in the guide track 18 and a second slot 28 in the cover 22 to permit the adjustment of the position of the anterior paddle 14 with respect to the posterior paddle 12 as will be further described below.

Referring to FIG. 2 and 3, the posterior paddle 12 is attached perpendicularly, at its upper end, to one end of the guide track 18 and cover 22. The anterior paddle 14 attaches, through a short stem 30, to a ball shaped knuckle 32 held against the lower surface of the guide track 18 and between the guide track 18 and the cover 22. The knuckle 32 may be moved along the guide track 18 toward and away from the posterior paddle 12 and may be rotated and angled with respect to the guide track 18. The guide track 18 includes a radiused channel 34 which conforms to the outer surface of the knuckle 32 for the various positions of the anterior paddle 14.

A knuckle shaft 36 extends horizontally through a corresponding bore 38 in the knuckle 32 to allow the knuckle 32 to pivot therearound. A threaded hole 40 positioned radially at the midline of the knuckle shaft 36 receives a threaded bolt 42 passing through an angularly elongate hole 43 (not visible) in the surface of the knuckle 32 opposing the anterior paddle 24, the hole restricting the pivoting of the knuckle 32 around the knuckle shaft 36 to within a predetermine range.

The threaded bolt 42 passes through the slot 26 and may be tightened to compress the knuckle 32 between the knuckle shaft 36 and the radiused channel 34 of the track 18, preventing movement of the knuckle 32 with respect to the track 18. The adjusting knob 24 forms the head of the threaded bolt 42 and seats against the outer surface of the track 18. A threaded lock nut 42 may be fitted between the adjusting knob 24 and the track 18 to adjust the depth to which the bolt 42 may be threaded into the knuckle shaft 36.

From this description it will be apparent that the anterior paddle 14 is restrained from motion with respect to the guide track 18 and the posterior paddle 12, when the bolt 42 is tightened, as a result of the frictional interfitting of the outer surface of the knuckle 32 and the radiused lower surface 34 of the track 18 and that the anterior paddle 14 has three degrees of freedom when the bolt 42 is loosened: (1) movement along the length of the track 18, (2) rotation about the axis formed by the bolt 42, and (3) angular movement about the knuckle shaft 36. These motions permit the two paddles 12 and 14 to be fit closely to the shoulder 16 and to be locked into position with the tightening of a single adjustment knob 24.

Referring to FIGS. 3 and 7, the rotational movement of the anterior paddle 14 is limited by the interfitting of a vane 46 and the slot 28 in the cover 22. This limitation of rotary motion by the vane 46 and slot 28 and the limitation of angular movement provided by the limited size of the hole 43 in the knuckle 32 serve to ensure that the two antenna loops within the paddles 12 and 14 remain aligned to within a predetermined amount and aids in positioning the coil 10 by preventing the paddles 12 and 14 from twisting or getting sufficiently far out of alignment so as to hinder rapid placement of the coil 10 on the shoulder of the patient 16.

The paddles 12 and 14 and guide track 18 and cover 22 are machined of a non-magnetic, non-conductive plastic material to reduce attenuation of the RF excitation field and to reduce distortion of the polarizing magnetic field $B_0$.

As has been mentioned, each paddle 12 and 14 contains an antenna loop with its axis 20 normal to the paddle surface. Referring to FIG. 4, the antenna loop 48 is constructed of circle of copper tubing 50 placed in the head of the paddle 12. The antenna loop axis 20 is defined, according to convention, as the axis of radial symmetry of the circle of copper tubing 50. At opposite points along the circumference of the antenna loop 48, generally aligned with the length of the paddle 12, the copper tubing 50 is cut and is joined together again via insulating spacers 52 and 54. These cut points will be termed interfaces. Short leads 56 connect the tubing 50 on each side of the interface, and hence on each side of insulating spacers 52 and 54, to circuit boards 58 and 60 as will be described further below. The insulating spacers 52 and 54 define interface capacitor 52' and 54' (no separately visible) between the halves of the antenna loop 48 so formed.

A pickup loop 62 formed from a circle of copper wire is placed within the circumference of the antenna loop 48 and supported by a non-conductive pad 64 so as to electrically couple to the antenna loop 48 through mutual inductance and to maintain a fixed distance from the patient. The pickup loop 62 is opened at one point along its circumference to form two terminals 66 which are attached to a circuit board 68 containing circuitry to be described.

Cables 70 and 72 ar connected to the circuit boards 60 and 68 and are channeled out of the handle of the paddle 12 and into the space between the guide track 18 and the cover 22. Specifically, a shielded co-axial 50 Ω linking cable 72 is connected to circuit board 60 associated with the antenna loop 48 and a similar 50 Ω signal cable 70 is connected to circuit board 68 associated with the pickup loop 62.

Referring to FIG. 2, the linking cable 72 is received by a receiving slot 74 in the knuckle 32 and may thread through an equatorial channel 76 cut in the knuckle shaft 36, as previously described, and up through the stem 30, which is hollow to accommodate the linking cable 72, and thence to the anterior paddle 14. The signal cable 70 exits though a hole in the guide track 18 and proceeds to a battery supply circuit to be described.

The anterior paddle 14 is electrically identical to the posterior paddle 12 except for the absence of a pickup loop 62 and its associated circuitry and for this reason, only the circuitry of the posterior paddle 12 will be described in detail. The absence of the pickup loop 62 from the anterior paddle 14 allows the anterior paddle 14 to include a centered circular aperture 78 in the paddle face to permit better visibility in positioning the paddle 14 with respect to the shoulder as shown in FIG. 1.

Figure 5:
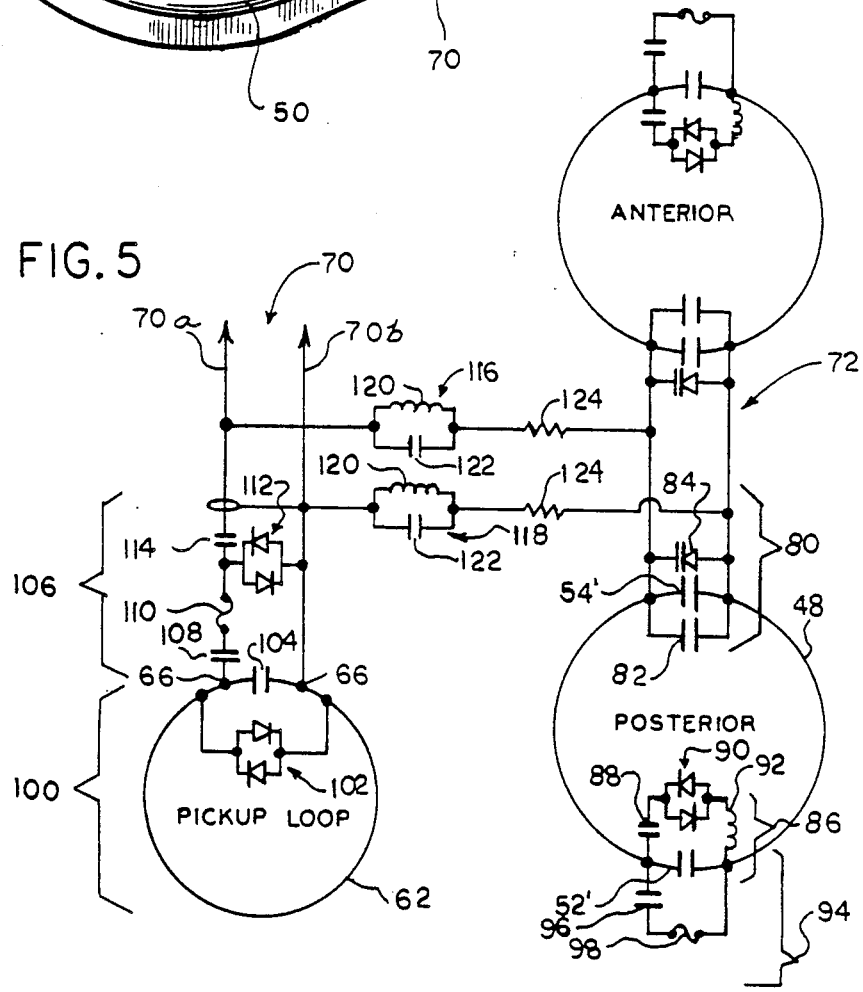
FIG. 5 is schematic of the electrical circuitry of the shoulder coil of the preceding Figures showing the placement of fuses and tuning varactor diodes.

Referring now to FIGS. 4 and 5, the posterior paddle 12 contains three functionally distinguishable circuits: The first circuit is a tuning circuit 80 formed by interface capacitor 54', tuning capacitor 82 and varactor 84 each which is connected in parallel across the interface capacitor 54'. As will be understood to those of ordinary skill in the art, the copper tubing 50 of the antenna loop 48 has a distributed inductance which when broken by interface capacitances 52' and 54' forms a resonant circuit. The frequency of this resonant circuit may be adjusted to the frequency of the MRI system of approximately 64 mHz by adjusting the interface capacitance for the interface 54 as determined by interface capacitor 54', tuning capacitor 82, and varactor 84. The capacitance of varactor 84 may be adjusted by varying the D.C. bias voltage across the varactor 84 and hence the varactor 84 may be used to tune the antenna loop 48. The connection of the D.C. bias voltage to the varactor 84 will be described in more detail below.

The second circuit associated with the posterior paddle 12 is a passive decoupling circuit 86 formed by a capacitor 88, back-to-back diodes 90 and inductance 92, all three connected together in series across interface capacitor 52' As is understood in the art, the back-to-back diodes 90, are constructed of two diodes having the anode of the first connected to the cathode of the second and the cathode of the first connected to the anode of the second to form a non-linear conductor which has a very high resistance for voltages below a forward bias voltage (approximately 0.7 volts for silicon diodes) and a low resistance for voltages above this threshold. When the voltage across the interface capacitor 52' in the antenna loop 48 is below the forward bias threshold of the back-to-back diodes, as will be the case when NMR signal is being detected, the capacitor 88 and inductor 92 are effectively disconnected from the antenna loop 48 and the antenna loop 48 is tuned to the frequency of the NMR signal. This tuning is determined primarily by the geometry of the antenna loop 48 and by capacitors 82, 54', 52', and varactor 84 as have been described. When the voltage on the antenna loop 48 increases above the forward bias threshold, as will happen when RF excitation signal is being transmitted, the back-to-back diodes 90 conduct and capacitor 88 and inductor 92 are electrically connected across the interface capacitance 52'. When so connected, the inductor 92 and capacitor 88 in conjunction with the distributed inductance of the antenna loop 48 and the interface capacitance 52' form a parallel resonant circuit having a high impedance at the frequency of the RF excitation. This creation of a parallel resonant circuit is termed "pole insertion". Thus the antenna loop 48 is effectively "broken" at the interface capacitor 52' reducing the coupling of energy into the antenna coil 48 from the RF excitation field as is desired.

The third circuit associated with the posterior paddle 12 is a fuse circuit 94 formed of a series connected capacitor 96 and fuse 98 together connected across the interface capacitance 52' to provide a secondary decoupling circuit in the event that the passive decoupling circuit 86, and particularly the back-to-back diodes 90, fail in an open configuration. If the passive decoupling circuit 86 opens, the current in the antenna loop 48 during RF excitation will increase. A portion of the increased current flowing though the antenna loop 48 will be diverted through the fuse 98 by the current divider formed of capacitor 52' and capacitor 96. If this current rises above a predetermined amount, the fuse 98 opens and capacitor 96 is effectively removed from the circuit. This change in total capacitance at interface 52 detunes the antenna loop 48 thereby reducing the coupling of RF energy into the antenna loop 48 during excitation of the nuclear spins.

The use of a current divider is critical in allowing the introduction of the fuse 98 into the antenna loop circuitry without unacceptably lowering the Q of the antenna loop 48. As will be appreciated in the art, a fuse 98 is necessarily resistive so as to generate the heat necessary to melt a conducting element suspended therein. Direct placement of commercially available resistive fuses in series with the antenna loop 48 would lower the Q of the antenna loop 48 to an unacceptable value. In the described configuration, the effective resistance of the fuse 98, as would affect the Q of the antenna loop 48, is decreased by the ratio of current flowing through each of capacitors 52' and 96. This reduction of effective resistance permits the use of the fuse 98 without unacceptable loss of Q in the antenna loop 48. In the preferred embodiment, approximately one third of the current in the antenna loop 48 is diverted through the fuse 98.

The circuitry of the anterior paddle 14 is identical to that described above and the antenna loops of the anterior and posterior paddles 14 and 12 are joined by means of the linking cable 72, previously described, which connects the varactor 84, in parallel, to the corresponding varactor in the anterior paddle 14 to receive the same DC biasing voltage, as will be described further below, and by the same means connects the copper tubing 50 on one side of the interfaces 52 and 54 to its corresponding coil half in the anterior coil 14 and connects the coil half on the other side of the interfaces 52 and 54 to its corresponding coil half in the anterior coil 14 so as to couple the RF energy between the coils as is generally understood in the art.

As mentioned above, the posterior paddle 12 also includes the pickup loop 62. The pickup loop 62 is associated with two functionally distinguishable circuits: The first circuit is a passive decoupling circuit 100 comprised of back-to-back diodes 102 connected across an impedance matching capacitor 104 in series with the two terminals of the pickup loop 62. These back-to-back diodes serve to detune the pickup coil 62 in the presence of large voltages induced during the RF excitation of the nuclear spins by shorting out capacitor connected between terminals 66 which affects the resonant frequency of the pickup loop 62. The method of passive decoupling of the pickup loop is different from that of the anterior and posterior coils 12 and 14 because the pick-up loop is not typically a resonant structure. Nevertheless, the decoupling circuit serves to ensure that no stray resonances exist during the transmit pulse.

The second circuit associated with the pickup loop is a fuse circuit 106 formed of a series connected capacitor 108, fuse 110, and back-to-back diodes 112 together connected across the tuning capacitor 104 to positively disconnect the pickup coil 62 in the event of high currents and failure of back-to-back diodes 102. Capacitor 108 is connected to one end of tuning capacitor 104 to create an impedance matching network to match the pick-up loop impedance to the 50 Ω cable 70. The back-to-back diodes 112 provide a low impedance path from the other side of fuse 110 to the other side of the tuning capacitor 104 allowing adequate current flow to open the fuse 110 during an over current condition. As a general matter, the signal cable 70, attached to the fuse 110 as will be described, does not have a sufficiently low impedance to allow enough current flow to open the fuse 110.

In distinction to the fuse circuit 94 of the anterior and posterior circuits described above, the fuse 110 positively disconnects the pickup coil 62 from the signal cable 70. One signal lead 70a of the signal cable 70 is connected through capacitor 114 to the junction between the fuse 110 and the back-to-back diodes 112. The capacitor 114 serves to block a DC biasing voltage, as will be described below, on signal lead 70a. When the fuse 110 is opened, the electrical path from the pickup loop 62 to the signal lead 70a of signal cable 70, is broken. A shield lead 70b of the signal cable 70 is connected to the junction between the tuning capacitor 104 and the back-to-back diodes 112.

Hence, it will be understood that there are three levels of coil and patient protection associated with the pickup coil 62. First, the back-to-back diodes 102 decouple the pickup coil 62 in the presence of high RF currents and clamp the voltage across the tuning capacitor 104 (and hence across the signal cable 70) to less than the forward biasing voltage of diodes 102. Second, the current divider of capacitors 104 and 108 and back-to-back diodes 112 detune the coil 62, in the event of failure of back-to-back diodes 102 in the open state and again clamp the voltage to the signal cable 70 at the forward biasing voltage of diodes 112. Finally, fuse 110 opens if the current in the pickup coil 62 exceeds its rating decreased by the factor of the current divider of capacitors 104 and 108. It is important the the fuse 110 have a current rating substantially below that of back-to-back diodes 112.

During the period when the NMR signal is being received from the patient, the pickup loop 62 couples inductively to the posterior coil 48 to receive the NMR signal from the patient and transmit that signal along the two leads 70a and 70b of the signal cable 70. The signal lead 70a of signal cable 70 is also attached to the cathode of varactor 84 in the posterior coil, and the cathode of its complement varactor in the anterior coil, through band reject filter 116. The shield lead 70b of signal cable 70 is attached to the anode of varactor 84 in the posterior coil, and the anode of its complement varactor in the anterior coil, through band reject filter 118.

The band reject filters 116 and 118 are each made up of of a parallel inductor 120 and capacitor 122, in series with resistor 124, as is generally understood in the art. Resistors 124 serve as voltage dividers for the DC bias applied via the cable 70 to the varactors 84. These filters 116 and 118 have a high impedance at a notch frequency tuned to be centered on the frequency of the RF excitation signal and MRI signal so as to prevent RF energy from being conducted directly between either of the anterior and posterior coils and the pickup coil 62.

Referring to FIG. 6, a positive DC biasing voltage is established on the signal lead 70a of signal cable 70 by means of a battery power supply 127 having a battery 125 of several dry cells chargeable by a battery charger 126 through a switch 128 as is generally understood in the art. A variable resistive divider 130, shunting the battery 125, provides an adjustable biasing voltage which is connected to the signal lead 70a of the signal cable 70 through a band reject filter 132 comprised of a parallel inductor and capacitor and tuned to the frequency the NMR signal to prevent signal loss into the low impedance battery power supply 127. The signal lead of signal cable 70 is also connected to an output lead 70a' of output cable 70' through a simple high pass network 133 having a cut off frequency below that of the NMR signal but sufficient to remove the D.C. biasing signal. The output cable 70' connects to MRI processing circuitry (not shown).

The shield lead 70b of the signal cable 70 connects to the ground of the battery power supply 127, through a band reject filter 131 which is identical to band reject filter 132.

An impedance matching circuit is also connected to the signal cable 70 to correct the patient-loss dependant impedance of the shoulder coils 10 and pick-up loop 62 via the odd, quarter-wavelength signal cable 70 to equal 50 Ω. This nominal impedance may deviate from 50 Ω in normal operation of the shoulder coil 10 as a result of coupling between the shoulder coil 10 and the patient. Accordingly, is connected to the signal lead 70a of the signal cable 70 and to either varactor 136 or both of varactors 136 and 138, through switch 140 to ground. Using both varactors 136 and 138 provides increased capacitance, which translates to inductive reactance at the pick-up loop 62 as is generally understood in the art. Capacitor 134 isolates the bias for the varactors 136 and 138 from signal cable 70.

The varactors 136 and 138 are biased by means of a second variable resistive divider 144 shunting the battery 125 and providing a second DC biasing signal to the cathode of varactor 136 and/or 138 through a band reject filter 142 constructed identically to band reject filters 131 and 132 described above. Accordingly, the bias to the varactor 136 or 138 may be changed by adjusting variable resistor 144 and thus the total compensating capacitance across the signal cable 70.

The above description has been that of a preferred embodiment of the present invention. It will occur to those who practice the art that many modifications may be made without departing from the spirit and scope of the invention. In order to apprise the public of the various embodiments that may fall within the scope of the invention, the following claims are made.

We claim:

1. A shoulder coil comprising
   a first paddle means for supporting a first antenna loop having a first antenna loop axis;
   a guide track fixed to said first paddle means the paddle means extending generally outward from the guide track in a plane perpendicular to the plane of the guide track;
   a joint fixed to a knuckle received by said guide track for sliding therealong and for rotating about a knuckle axis substantially parallel to the plane of the guide track;
   a second paddle attached to the joint to extend outward from the guide track, the second paddle supporting a second antenna loop having a second antenna loop axis being substantially perpendicular to the knuckle axis; and
   clamping means for restraining the knuckle in a fixed position against the track.

2. The shoulder coil of claim 1 wherein the guide track has a track slot along its length and wherein the clamping means comprises:
   a knuckle shaft extending though the knuckle along the knuckle axis; and
   a bolt having a threaded shaft and a head, the threaded shaft passing through the track slot and received by the knuckle shaft and the head abutting the surface of the track opposite the surface upon which the knuckle slides wherein turning of the bolt pulls the knuckle shaft toward the track.

3. The shoulder coil of claim 2 wherein the knuckle has a first aperture for receiving an electrical cable from the first antenna loop for connecting the first and second antenna loop and the knuckle shaft has an equatorial channel for guiding the cable to a second aperture in the knuckle leading to the second paddle.

4. The shoulder coil of claim 1 wherein the knuckle is spheroidal and the surface of the track on which the knuckle slides has a radiused cross section conforming the knuckle.

5. The shoulder coil of claim 1 including a track cover covering the guide track and having a cover slot extending along the length of the guide track, the knuckle being retained between the guide track and the track cover, and the second paddle extending through the cover slot, and wherein the knuckle includes a vane interfitting with the edges of the cover slot to maintain the second loop axis parallel to the first loop axis within a predetermined range of deviation.

6. An RF local coil for use in receiving RF signals near a resonant frequency for MRI imaging comprising:
   an antenna loop having an open section forming a first and second terminal;
   a non-resistive current divider having a first leg with a first reactance connected in series between the first and second terminal of the antenna loop and a second leg with a second reactance for receiving current from one of the first and second terminals; and a fusible link connected in series with the second leg between the first and second terminals.

7. The RF local coil of claim 6 wherein the first and second reactance tune the coil to the resonant frequency.

8. The RF local coil of claim 6 where the first and second reactance are capacitive.

9. In MRI imaging, an RF local coil for use in receiving RF signals from an imaged object and providing the RF signals at a pair of output terminals, the RF signals being near a resonant frequency, the RF coil comprising:
- a primary antenna loop tuned to the resonant frequency;
- a pick-up coil electromagnetically communicating with the primary antenna loop and having an open segment forming a first and second terminal;
- a non-resistive current divider having a first leg with a first reactance connected in series between the first and second terminal of the pick-up loop and a second leg with a second reactance for receiving current from one of the first and second terminals;
- a fusible link connected in series with the second leg;
- a first non-linear conductor for conducting current when the voltage across the conductor exceeds a predetermined threshold value connected in series with the fusible link and to the other first and second terminal; and wherein the output terminals are connected across the non-linear conductor.

10. The RF local coil of claim 9 wherein a second nonlinear conductor is connected across the first leg of the current divider.

11. An RF local coil for use in receiving RF signals at a resonant frequency for MRI imaging comprising:
- an antenna loop having an open segment forming a first and second terminal;
- a DC bias means for producing a DC bias voltage;
- a conductor connected at a first end to the DC bias means and communicating at the second end with the antenna loop for receiving RF signals from the antenna loop and bias voltage from the DC bias means;
- a varactor means in series with the first and second terminal for tuning the antenna loop to the resonant frequency; and
- a band reject filter tuned to the resonant frequency for connecting the varactor means to the second end of the conductor wherein the DC bias voltage but not the RF signal is provided to the varactor.

12. The RF local coil of claim 11 including:
an output lead; and
a high pass filter connected between the output lead and the first end of the wire for filtering the bias voltage from the RF signal.

* * * * *